United States Patent [19]
Oda et al.

[11] Patent Number: 5,639,206
[45] Date of Patent: Jun. 17, 1997

[54] TRANSFERRING DEVICE

[75] Inventors: Yoshimasa Oda; Shinji Koyano; Akinobu Harada, all of Narashino, Japan

[73] Assignee: Seiko Seiki Kabushiki Kaisha, Japan

[21] Appl. No.: 434,513

[22] Filed: May 4, 1995

Related U.S. Application Data

[63] Continuation of Ser. No. 112,619, Aug. 26, 1993, abandoned.

[30] Foreign Application Priority Data

Sep. 17, 1992 [JP] Japan ............... 4-064816 U

[51] Int. Cl.$^6$ ............................. B25J 13/00
[52] U.S. Cl. ............... 414/749; 414/744.6; 198/619; 901/23
[58] Field of Search ............... 414/749, 751, 414/3, 4, 744.6, 744.2; 198/619; 901/23, 24; 104/290, 291

[56] References Cited

U.S. PATENT DOCUMENTS

| | | | |
|---|---|---|---|
| 3,779,401 | 12/1973 | Carroll | 198/619 X |
| 3,882,789 | 5/1975 | Simon et al. | 104/290 X |
| 4,971,512 | 11/1990 | Lee et al. | 414/751 X |
| 4,998,859 | 3/1991 | Oshima et al. | 414/751 X |
| 5,270,600 | 12/1993 | Hashimoto | 310/75 D |
| 5,288,199 | 2/1994 | Enomoto et al. | 414/749 |

Primary Examiner—Donald W. Underwood
Attorney, Agent, or Firm—Adams & Wilks

[57] ABSTRACT

A transferring device is provided for transferring an article between vacuum chambers. The transferring device comprises a cylindrical float member, and a transferring rod connected to and extending along an axial direction for supporting an article. At least one magnetic member is disposed on a peripheral surface of the float member. A cylindrical partition member having a thin, uniform circular cross-sectional thickness is disposed between the electromagnet and the float member. A support member is disposed within the partition member for reciprocating movement between opposite ends of the partition member. The support member supports at least one electromagnet and at least one sensor in spaced apart and facing relation with respect to the magnetic member for magnetically floating the float member and to drive the same in the axial direction. During reciprocating movement of the support member within the partition member, the magnetic force generated by each of the electromagnets acts on each magnetic member through the cylindrical partition member to move the float member in synchronism with the reciprocative motion of the support member. The current required to excite the electromagnets is reduced, and the transferring device can be designed in small scale with high mechanical strength and rigidity.

19 Claims, 3 Drawing Sheets

TRANSFERRING DEVICE

This is a continuation application of Ser. No. 08/112,619 filed Aug. 26, 1993, now abandoned.

BACKGROUND OF THE INVENTION

1. Field of the Invention

This invention relates to a transferring device for transferring an article between plural vacuum chambers in an CVD device, an etching device, a sputtering device, an inspection device, etc. used to manufacture an electronic device such as a semiconductor integrated circuit.

2. Description of Related Art

Transferring devices have been conventionally designed to include in a vacuum chamber a cylindrical bulkhead (partition wall) having a rectangular cross-section or a cylindrical bulkhead having a circular cross-section in which both of a thick portion and a thin portion coexist as shown in FIG. 3. In both of the transferring devices, the atmospheric state at the inner peripheral surface side $1a$ of the bulkhead is maintained. A float member 3 having a transferring rod is disposed at the outer peripheral surface side $1b$ of the bulkhead while a main body 4 of the transferring device is provided at the inner peripheral surface side of the bulkhead. The main body 4 of the transferring device includes a magnetic bearing at the outer peripheral portion $4a$ thereof, and is so designed as to be reciprocatively moved between both ends of the bulkhead. The magnetic bearing comprises plural electromagnets 10 and 11 and a sensor portion. The sensor portion detects the floating position of the float member, and each electromagnet is excited on the basis of a detection value which is outputted from the sensor portion. Through this operation, magnetism acts on the float member through the bulkhead to support the float member. In the transferring device as described above, the float member is supported by the magnetic bearing in a magnetically floating state, and when the main body of the transferring device is reciprocatively moved, the magnetically-supported float member is also reciprocatively moved in synchronism with the reciprocative motion of the main body. As a result, the transferring rod of the float member serves to transfer an article.

However, in such a conventional transferring device, the bulkhead is deformed due to a pressure difference between the outer peripheral surface side of the bulkhead (vacuum) and the inner peripheral surface side (air atmosphere) in a case where the bulkhead is designed in a cylindrical shape having a rectangular cross-section. This deformation can be prevented by forming the bulkhead to be thicker. If the thickness of the bulkhead is increased, the magnetic force acting on the float member from an electromagnet through the bulkhead is weakened, and thus it is required to increase exciting current of the electromagnet. Therefore, there occur disadvantages that the power consumption of the device becomes increased, and that the whole device is heated. On the other hand, in a device having a cylindrical bulkhead having a circular cross-section (in place of the cylindrical bulkhead having a rectangular cross-section as described above), low power consumption and prevention of the heating of the device can be achieved by decreasing the thickness of a portion of the bulkhead which confronts the electromagnet and increasing the thickness of another portion of the bulkhead which does not confront the electromagnet. However, it is difficult to produce such a circular-cross-sectional cylindrical bulkhead having a variable thickness. Further, the size in the vertical direction of the device is increased because support portions 15 and 16 must be provided at the lower portion of the bulkhead, and the rigidity of the device is weakened because an opening portion is provided at the lower portion of the float member. If the rigidity of the device is increased, there would occur various problems that the device must be designed in large-scale and greater weight, and that the exciting current must be increased.

SUMMARY OF THE INVENTION

An object of this invention is to provide a transferring device having a bulkhead a partition wall which is designed in a homogeneously-or uniform thin cross-sectional thickness and completely circular shape, and a float member which is designed to have a completely circular cross-section, thereby achieving prevention of heating of the device, low power consumption, compact size and high rigidity.

In order to attain the above object, the transferring device according to this invention comprises a homogeneously thin cylindrical bulkhead or partition wall having a completely circular cross-section, a float member having a circular cross-section which is disposed at the outer peripheral surface side of the bulkhead and has a transferring rod, a transferring main body support member which is disposed at the inner peripheral surface side of the bulkhead and is reciprocatively movable between both ends of the bulkhead, a magnetic bearing unit which is disposed on the outer peripheral surface of the transferring main body, has electromagnets and sensor units and supports the float member through the electromagnets, and a target formed in the float member so as to confront the electromagnets and the sensor units of the magnetic bearing.

According to the transferring device thus constructed, the magnetic force of the electromagnet acts on the target of the float member having a circular cross-section through the thin bulkhead. Therefore, the rigidity of the float member is improved, and the float member can be designed compact in size and light in weight. In addition, the float member can be supported by a small amount of exciting current.

DETAILED DESCRIPTION OF THE PREFERRED EMBODIMENTS

Figure 1:
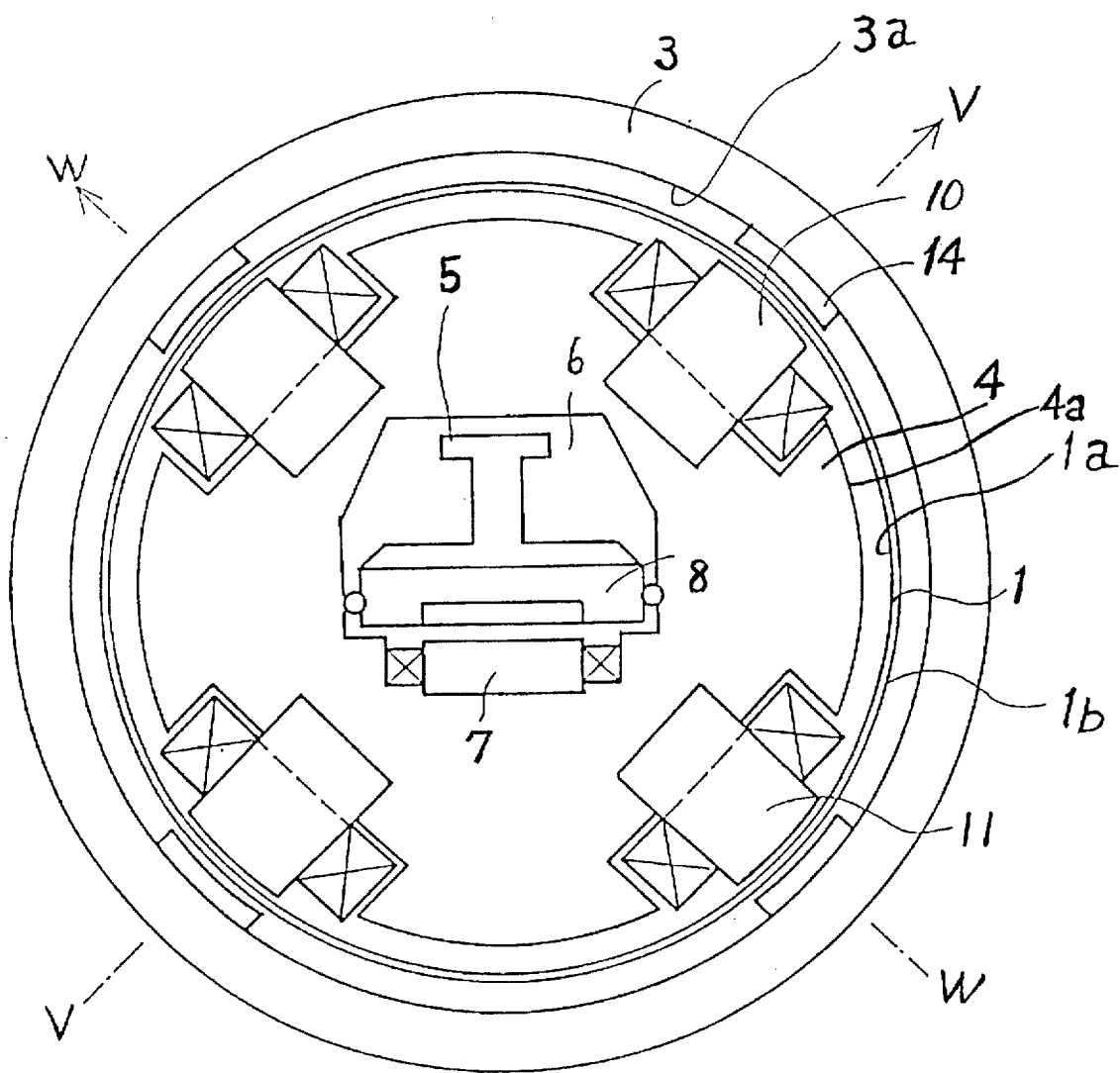
FIG. 1 is a cross-sectional view of a bulkhead or partition wall of an embodiment of this invention.
Figure 2:
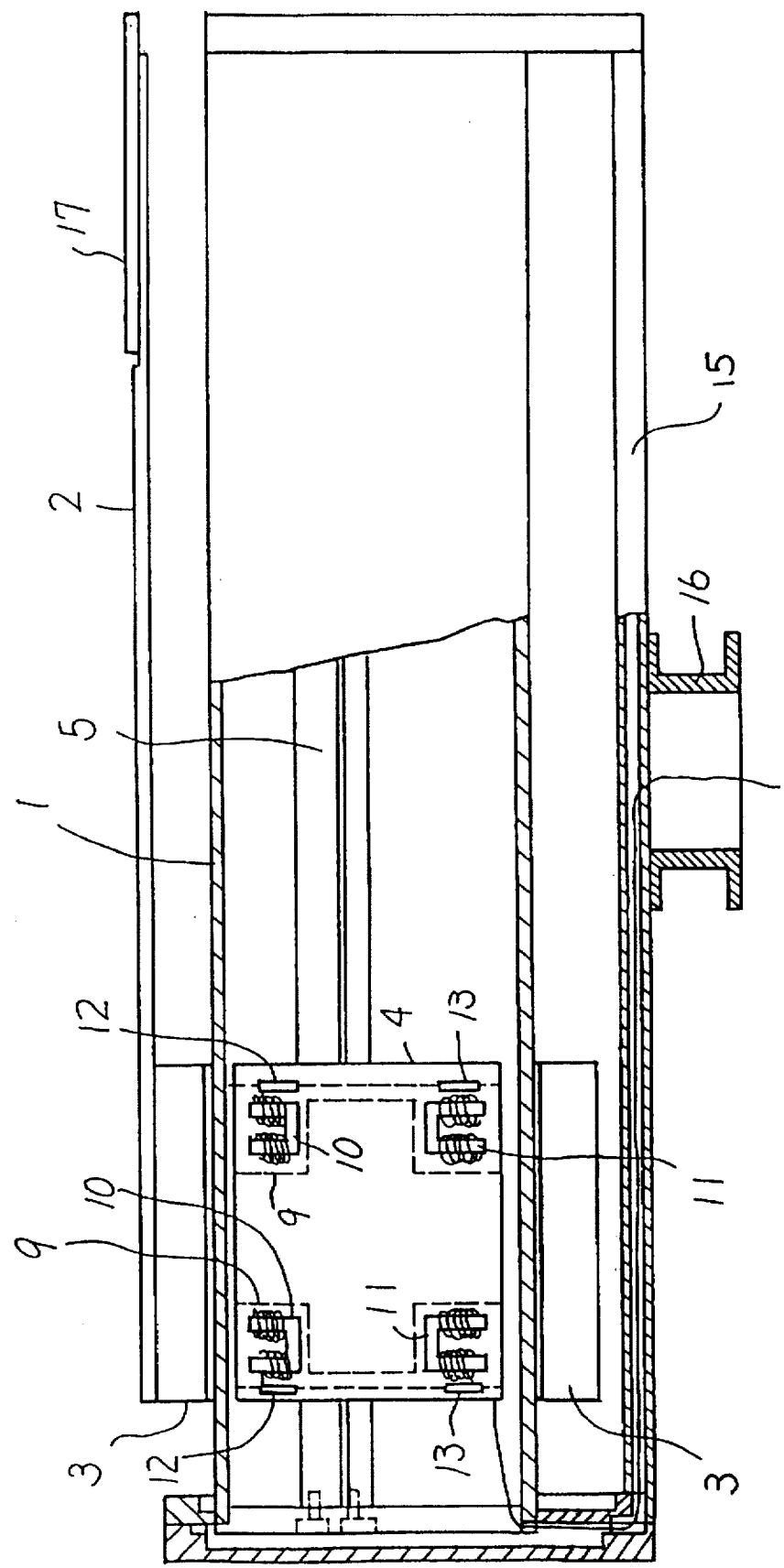
FIG. 2 is a front cross-sectional view of the embodiment of this invention.
Figure 3:
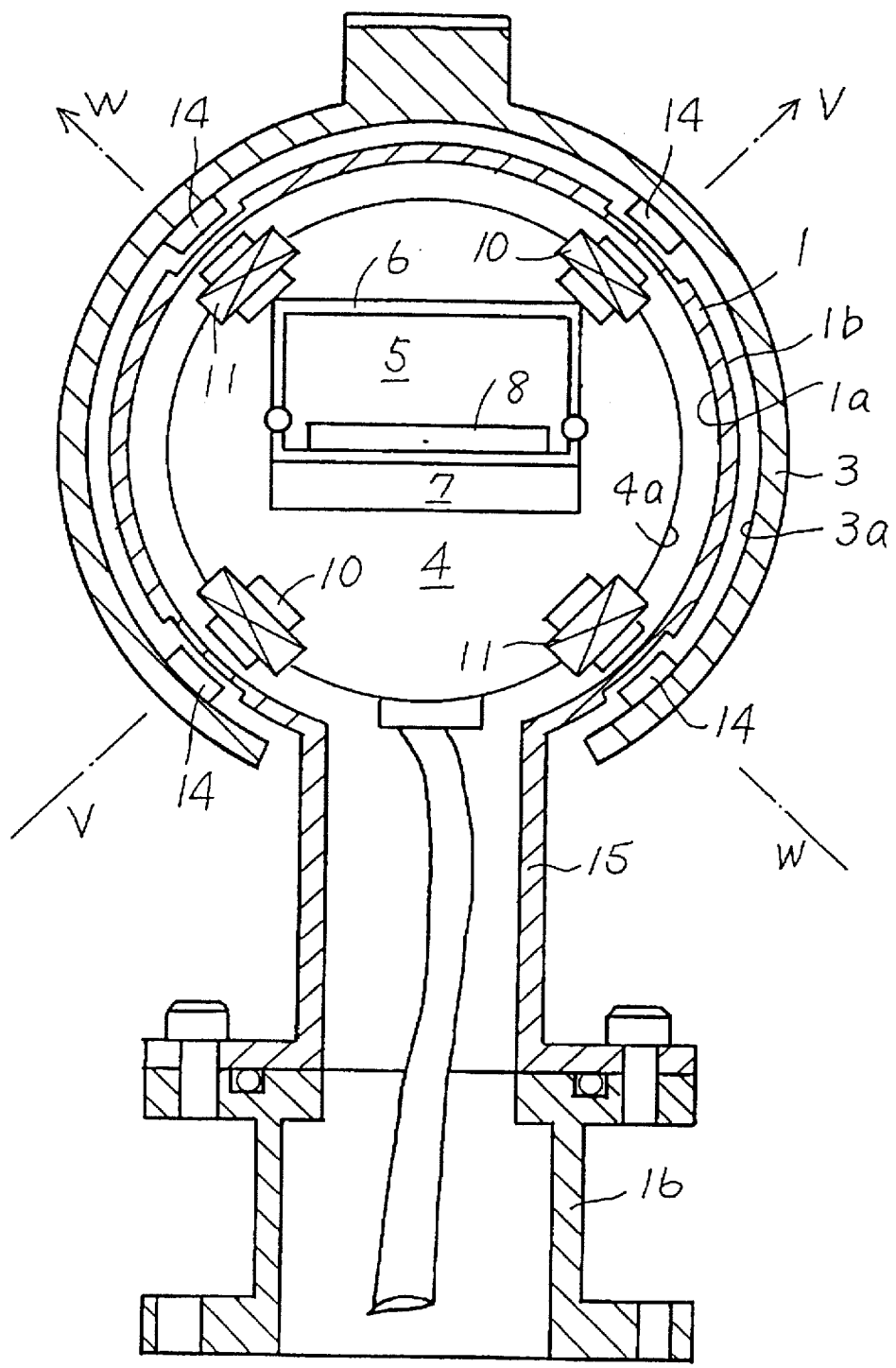
FIG. 3 is a cross-sectional view, of a conventional bulkhead.

A preferred embodiment according to this invention will be hereunder described above with reference to the accompanying drawings. FIG. 1 is a cross-sectional view of a bulkhead portion or partition wall of an embodiment of this invention, and FIG. 2 is a partial front cross-sectional view of the embodiment.

The transferring device includes a cylindrical bulkhead or partition wall 1 having a circular cross-section in a vacuum chamber as shown in FIG. 1, and the inner peripheral surface $1a$ of the bulkhead is kept at ambient atmospheric condition. A float member 3 having a transferring rod 2 (as shown in FIG. 2) for transferring an article 17 is provided at the outer peripheral surface $1b$ of the bulkhead 1. The float member 3 is designed in a completely cylindrical shape such that the diameter thereof is slightly larger than the outer diameter of the bulkhead 1, and is disposed such that the inner peripheral surface 3a thereof is confronted with the outer peripheral surface 1b of the bulkhead 1. On the other hand, a main body 4 of the transferring device (hereinafter referred to as "transferring main body"), which is designed in a solid cylindrical shape and whose outer diameter is slightly smaller than the inner diameter of the bulkhead, is disposed at the inner peripheral surface 1a side such that the outer peripheral surface 4a of the transferring main body 4 confronts the inner peripheral surface 1a of the bulkhead 1. The transferring main body 4 is disposed so as to be reciprocatively movable along a guide rail 5, and the guide rail 5 is bridged between both ends of the bulkhead 1 through an opening portion 6 of the transferring main body 4 (see FIG. 1).

As described above, the transferring main body 4 is so designed as to be reciprocatively movable between both ends of the bulkhead 1 along the guide rail 5. That is, a linear motor coil 7 is disposed at the opening portion 6 of the transferring main body 4, and a motor secondary, conductor 8 is provided to the guide rail 5 confronting the linear motor coil 7. The transferring main body 4 is designed to be reciprocatively movable along the guide rail 5 through the linear motor coin 7 and the motor secondary conductor 8. A pair of magnetic bearings 9 are disposed at the transferring main body 4 (see FIG. 2), and each magnetic bearing 9 includes two electromagnets 10 on a V-axis and two electromagnets 11 on a W-axis, and sensor units 12 and 13. The electromagnets 10 and 11 and the sensor units 12 and 13 are integrally disposed on the outer peripheral surface 4a of the transferring main body 4 so as to confront the inner peripheral surface 1a of the bulkhead 1.

The sensor unit 12 is located in the vicinity of the V-axis, and serves to detect the float position of the float member 3 on the V-axis. On the other hand, the sensor unit 13 is located in the vicinity of the W-axis, and serves to detect the float position of the float member 3 on the W-axis. As described above, the pair of magnetic bearings 9 are designed such that each of the electromagnets 10 and 11 is excited by a current controlled by the magnetic bearings 9 in accordance with the detection value output from each of the sensor units 12 and 13 and the float member 3 is supported by magnetic force.

Four targets 14 are provided on the inner peripheral surface 3a of the float member 3, and these targets 14 are formed of magnetic material and disposed at such positions as to confront the four electromagnets, respectively. The bulkhead 1 is linked to a rotational shaft 16 through a support portion 15, and it is rotated by rotation of the rotational shaft 16.

Next, the operation of the transferring device thus constructed will be described with reference to FIGS. 1 and 2.

According to the transferring device of this invention, the float member 3 is in a magnetically floating state supported by a pair of magnetic bearings 9. At this time, the magnetic force supplied from each of the electromagnets 10 and 11 acts on each target 14 through the bulkhead 1. When the transferring main body 4 is reciprocatively moved while the float member 3 is supported in the manner as described above, the magnetically-supported float member 3 is also reciprocatively moved simultaneously with the reciprocative motion of the transferring main body 4. Through this operation, the transferring rod 2 of the float member 3 transfers the article 17. Further, in this transferring device, if the bulkhead 1 is rotated by rotating the rotational shaft 16, the transferring direction of the transferring rod 2 can be altered to any direction.

According to the embodiment as described above, the manufacturing process is more easily performed because the bulkhead confronting the electromagnets and the sensor units are designed in a homogeneously thin and completely cylindrical shape, and the mechanical strength of the device is improved because of its completely cylindrical shape. Further, the entire transferring device can be designed in small scale because no support portion is required at the lower portion of the bulkhead. In addition, the float member of this embodiment has an improved rigidity over the conventional float member having an opening because the float member is completely cylindrical, and thus the shape of the float member can be designed in small scale and light in weight, so that the float member can be supported with a small amount of exciting current. Therefore, prevention of heating of the device and low current inputs and power consumption can be achieved.

In this embodiment, a linear motor is used as a driving source. However, it is understood that other driving system such as, for example, a ball screw and a motor or the like, can be used. Further, in this embodiment a rotational shaft is used. However, the rotating mechanism in this embodiment may be omitted. In addition, an elevating mechanism could be added to the rotating mechanism of this embodiment. Still further, in this embodiment the outer peripheral side of the bulkhead is kept in a vacuum state. However, the outer peripheral side of the bulkhead may be kept at ambient atmospheric conditions.

As described above, the manufacturing process is more easily performed because the bulkhead confronting the electromagnets and the sensor units is designed in a homogeneously thin and completely cylindrical shape, and the mechanical strength of the device is improved because of its completely cylindrical shape. Further, the whole device can be designed in small scale because no support portion is required at the lower portion of the bulkhead. In addition, the float member of this embodiment has an improved rigidity over the conventional float member having an opening because the float member is completely cylindrical, and thus the shape of the float member can be designed in small-scale and light in weight, so that the float member can be supported with a small amount of exciting current. Therefore, prevention of heating of device and the low current inputs and power consumption can be achieved.

What is claimed is:

1. A transferring device comprising: a float member having a closed circular cross section and a peripheral surface extending along the axial length of the float member; a transferring rod connected to the float member and extending along an axial direction for supporting an article; sensing means for sensing the position of the float member in a direction transverse to the axial direction; first magnetic means including a set of magnetic members disposed on the peripheral surface of and in circumferentially spaced-apart relation around the float member; second magnetic means including a set of electromagnets spaced apart from and facing respective ones of the magnetic members and coacting therewith for magnetically floating the float member, the first magnetic means extending into a space defined between the float member and the second magnetic means; support means for movably supporting the second magnetic means; and drive means for driving the support means in the axial direction to thereby drive the float member.

2. A transferring device according to claim 1; further comprising a partition member disposed between the float member and the second magnetic means, the partition member being of uniform thickness and having a cross-section in the shape of a circle.

3. A transferring device according to claim 1; further comprising means for rotating the partition member about an axis transverse to the axial direction.

4. A transferring device according to claim 1, wherein the drive means comprises a linear motor.

5. A transferring device comprising: a float member having a closed circular cross section and a peripheral surface extending along the axial length of the float member; a transferring rod connected to the float member and extending along an axial direction for supporting an article; sensing means for sensing the position of the float member in a direction transverse to the axial direction; at least one magnetic member disposed on the peripheral surface of the float member; magnetic means spaced apart from and facing the magnetic member for magnetically floating the float member, the magnetic member extending into a space defined between the float member and the magnetic means; a partition member having a circular cross section and disposed between the float member and the magnetic means; support means for movably supporting the magnetic means; and drive means for driving the support means in the axial direction to thereby drive the float member.

6. A transferring device according to claim 5; wherein the partition member has a uniform thickness and a cross-section in the shape of a closed circle.

7. A transferring device according to claim 5; further comprising guide means within the partition member and extending between opposite ends thereof for guiding the movement of the support means in the axial direction.

8. A transferring device according to claim 5; wherein the magnetic means comprises at least one electromagnet spaced from and facing the magnetic member.

9. A transferring device according to claim 5; wherein the sensing means comprises at least one sensor supported by the support means.

10. A transferring device comprising: a float member having a closed circular cross section and an inner peripheral surface extending axially along the length thereof; a transferring rod attached to an outer peripheral surface of the float member and extending along an axial direction for supporting an article; at least one magnetic member disposed on the inner peripheral surface of the float member; at least one electromagnet spaced apart from and facing the magnetic member for magnetically floating the float member, the magnetic member extending into a space defined between the float member and the electromagnet; a cylindrical partition member disposed between the float member and the electromagnet, the partition member having a uniform thickness and a circular cross-section; at least one sensor spaced apart from and facing the magnetic member for sensing the position of the float-member in a direction transverse to the axial direction; a support member for supporting the electromagnet and the sensor; and drive means for driving the support member in the axial direction to thereby drive the float member.

11. A transferring device according to claim 10; further comprising guide means within the partition member and extending between opposite ends thereof for guiding movement of the support member in the axial direction.

12. A transferring device according to claim 11; wherein the drive means comprises a linear motor.

13. A transferring device according to claim 1; wherein the peripheral surface of the float member comprises a cylindrical peripheral wall extending the entire axial length of the float member.

14. A transferring device according to claim 5; wherein the peripheral surface of the float member comprises a cylindrical peripheral wall extending the entire axial length of the float member.

15. A transferring device according to claim 10; wherein the inner peripheral surface of the float member comprises a cylindrical peripheral wall extending the entire length of the float member.

16. A transferring device comprising: a float member having a closed circular cross section and an inner peripheral surface extending axially along the length thereof and having an outer peripheral surface; a transferring rod attached to the outer peripheral surface of the float member and extending along an axial direction for supporting an article; a plurality of magnetic members disposed on the inner peripheral surface of the float member; a plurality of electromagnets spaced apart from and facing the magnetic members for magnetically floating the float member, the magnetic members extending into a space defined between the float member and the electromagnets; a cylindrical partition member disposed between the float member and the electromagnets, the partition member having a uniform thickness and a circular cross-section; a plurality of sensors spaced apart from and facing the magnetic members for sensing a distance between the cylindrical partition member and the magnetic members; control means for controlling an electric current flowing through the electromagnets in accordance with the distance determined by the sensing means; a support member for supporting the electromagnets and the sensors; and drive means for driving the support member in the axial direction to thereby drive the float member.

17. A transferring device according to claim 16; further comprising guide means within the partition member and extending between opposite ends thereof for guiding movement of the support member in the axial direction.

18. A transferring device according to claim 17; wherein the drive means comprises a linear motor.

19. A transferring device according to claim 16; wherein the inner peripheral surface of the float member comprises a cylindrical peripheral wall extending the entire length of the float member.

* * * * *